(12) United States Patent
Gottlieb et al.

(10) Patent No.: US 7,057,475 B2
(45) Date of Patent: Jun. 6, 2006

(54) FERRITE CHOKE

(75) Inventors: Gary Gottlieb, Irvine, CA (US); Kamran Kohan, Orange, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/691,248

(22) Filed: Oct. 22, 2003

(65) Prior Publication Data

US 2005/0088256 A1    Apr. 28, 2005

(51) Int. Cl.
    *H03H 7/00*    (2006.01)
(52) U.S. Cl. .............. 333/181; 333/12; 379/392.01
(58) Field of Classification Search ............ 333/12, 333/181, 182, 185; 379/392.01, 399.01, 379/416, 417, 413.04, 325–328; 361/818, 361/118
See application file for complete search history.

(56) References Cited

U.S. PATENT DOCUMENTS

| | | | | |
|---|---|---|---|---|
| 2,865,006 A | * | 12/1958 | Sabaroff | 333/33 |
| 3,516,026 A | * | 6/1970 | Curran et al. | 333/12 |
| 3,551,858 A | * | 12/1970 | Cielo | 333/182 |
| 3,996,537 A | * | 12/1976 | Neuman | 333/177 |
| 5,287,008 A | * | 2/1994 | Pahr | 307/91 |
| 5,321,373 A | * | 6/1994 | Shusterman et al. | 333/12 |
| 5,346,410 A | * | 9/1994 | Moore, Jr. | 439/607 |
| 5,768,600 A | * | 6/1998 | Williams | 713/300 |
| 5,902,957 A | * | 5/1999 | Takahashi et al. | 174/36 |
| 6,225,876 B1 | * | 5/2001 | Akino et al. | 333/182 |
| 6,252,163 B1 | * | 6/2001 | Fujimori et al. | 174/36 |
| 6,492,588 B1 | * | 12/2002 | Grandy | 174/36 |
| 6,517,384 B1 | * | 2/2003 | Murasawa et al. | 439/620 |
| 6,561,836 B1 | * | 5/2003 | Marshall et al. | 439/378 |
| 6,633,000 B1 | * | 10/2003 | Kuo | 333/12 |
| 6,738,463 B1 | * | 5/2004 | Schmokel | 379/166 |
| 6,744,613 B1 | * | 6/2004 | McCook et al. | 361/118 |
| 6,781,481 B1 | * | 8/2004 | Richardson | 333/181 |
| 2004/0114298 A1 | * | 6/2004 | Hsu et al. | 361/118 |
| 2004/0213188 A1 | * | 10/2004 | Struhsaker et al. | 370/336 |
| 2005/0140464 A1 | * | 6/2005 | Hofmeister et al. | 333/167 |

FOREIGN PATENT DOCUMENTS

JP    2000228319 A  *  8/2000

* cited by examiner

*Primary Examiner*—Seungsook Ham
(74) *Attorney, Agent, or Firm*—Fogg and Associates LLC; Scott V. Lundberg

(57) ABSTRACT

An apparatus to filter noise from being induced into a power line. In one a ferrite choke is disclosed that filters noise from being induced into a power line. The ferrite choke includes a tube of ferrite, a supply power line and a return power line. The tube of ferrite is made of a single piece of ferrite. The supply power line is received inside the tube of ferrite and the return power line is also received inside the tube of ferrite.

28 Claims, 5 Drawing Sheets

FERRITE CHOKE

TECHNICAL FIELD OF THE INVENTION

The present invention relates generally to filtering noise in wires and in particular a filtering system with a ferrite choke.

BACKGROUND OF THE INVENTION

Devices coupled to receive power from a power source can be susceptible to cross-talk. A common cause of cross-talk is noise returned over a power line to the power source from devices which are coupled to receive power from the power source. This cross-talk can interfere with proper function of other the devices coupled to receive power from the power supply as well as the power source itself. In regards to telecommunication systems, the Federal Communication Commission (FCC) sets out limits on the amount of noise a device can produce. One common method used to reduce noise in a wire is with a ferrite clamp. A ferrite clamp generally comprises two halves of ferrites that are clamped around the wire. The ferrite clamp absorbs a certain amount of noise in the wire to help prevent cross-talk. However, the use of ferrite clamps on devices with circuits that produce multiple frequencies is limited. One of the limitations of ferrite clamps is that the surface areas of the two halves of a clamp that abut each other to encase a wire tend to have small gaps that reduce the effectiveness of the ferrite clamp. In spite of the limitations of ferrite clamps, telecommunication providers have tried to resolve the problem of noise returning to a power source from a chassis by using ferrite clamps to the power lines outside the chassis. However, since ferrite is very fragile, extra precautions must be taken in making sure the ferrite clamps are protected.

For the reasons stated above, and for other reasons stated below that will become apparent to those skilled in the art upon reading and understanding the present specification, there is a need in the art for an improved method of reducing noise in a wire.

SUMMARY

The above-mentioned problems and other problems are resolved by the present invention and will be understood by reading and studying the following specification.

In one embodiment, a ferrite choke is disclosed. This ferrite choke includes a tube of ferrite, a supply power line and a return power line. The tube of ferrite is made of a single piece of ferrite. The supply power line is received inside the tube of ferrite and the return power line is also received inside the tube of ferrite.

In another embodiment, another ferrite choke is disclosed. This ferrite choke includes a primary tube of ferrite, a redundant tube of ferrite, a primary supply wire, a primary return wire, a redundant supply wire, a redundant return wire and a protective covering. The primary supply wire is received inside the primary tube of ferrite and the primary return wire is also received inside the primary tube of ferrite. The redundant supply wire is received inside the redundant tube of ferrite and the redundant return wire is also received inside the redundant tube of ferrite. The protective covering is adapted to couple primary and redundant tubes of ferrite together.

In yet another embodiment, a $\pi$ filter is disclosed. The $\pi$ filter includes a primary ferrite choke, a first primary capacitor, a second primary capacitor and a third primary capacitor. The primary ferrite choke includes a primary tube of ferrite made of a single piece of ferrite. A primary supply wire is received inside the tube of ferrite. Moreover, a primary return wire is also received inside the primary tube of ferrite. The first primary capacitor is coupled between the primary supply wire and ground. The second primary capacitor is coupled between the primary return wire and ground and the third primary capacitor coupled between the primary supply wire and the primary return wire.

In further another embodiment, a chassis in a telecommunication system is disclosed. The chassis includes a housing and a $\pi$ filter. The housing has a backplane. The backplane is adapted to receive a plurality of line cards, multiplexer cards and a management card. The backplane is further adapted to receive power from a power supply. The $\pi$ filter is housed inside the chassis and is coupled between the power supply and the backplane. The $\pi$ filter is adapted to reduce noise induced back to the power supply.

In further yet another embodiment, a telecommunication system is disclosed. The telecommunication system includes a central office and a chassis. The central office is coupled to a network to exchange information. The central office includes a power supply. The chassis is coupled to the central office to exchange information. The chassis is further adapted to pass on information to user equipment. The chassis is also coupled to receive power from the power supply in the central office. The chassis further includes a $\pi$ filter housed inside the chassis that is adapted to filter out noise returned to the power supply from the chassis.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout the Figures and text.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, electrical or mechanical changes may be made without departing from the scope of the present invention. The following detailed description is, therefore, not to be taken in a limiting sense, and the scope of the present invention is defined only by the appended claims and equivalents thereof.

Embodiments of the present invention provide a system of reducing noise induced back to a power source with a π filter housed in a chassis. Embodiments of the present invention include one or more ferrite chokes. One embodiment of the ferrite choke includes a tube of ferrite formed from a single piece of ferrite and having a supply wire and return wire running though the tube.

Figure 1:
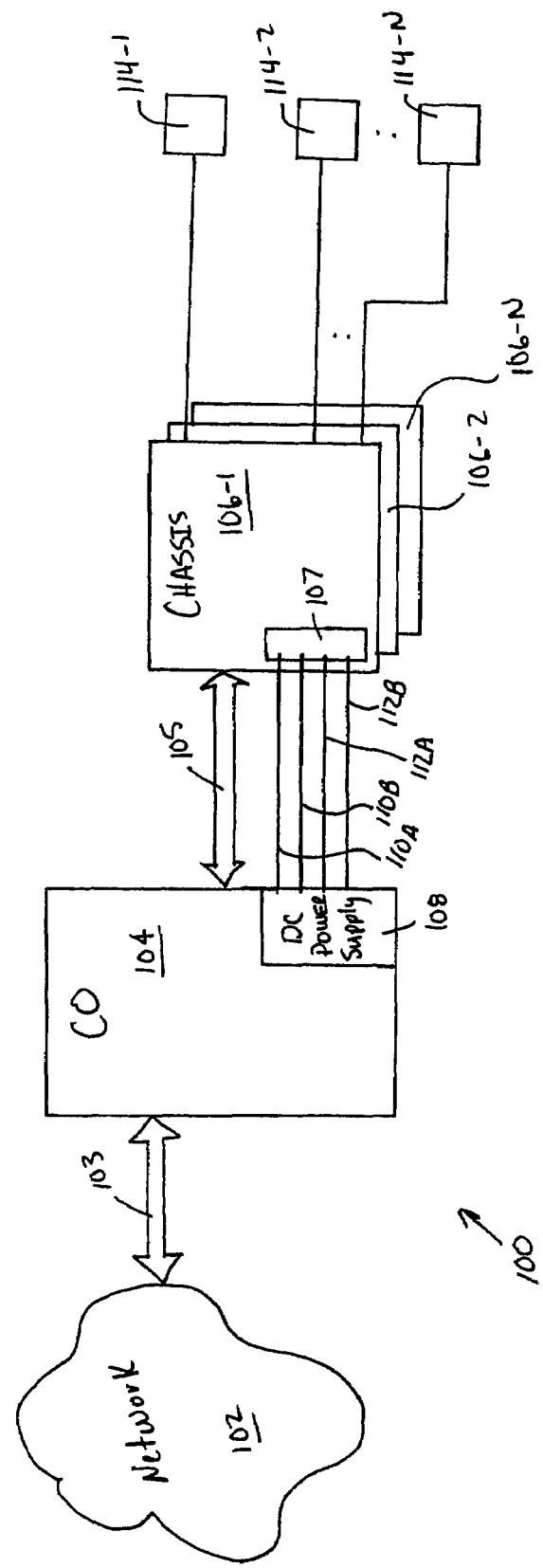
FIG. 1 is a block diagram of a telecommunication system of one embodiment of the present invention.

Referring to FIG. 1, a communication system 100 of one embodiment of the present invention is illustrated. As illustrated the communication system 100 includes a network 102, a central office (CO) 104, chassis 106 (1-N) and a plurality of user equipment 114 (1-N). The central office 104 is coupled to the network 102 to exchange information across communication link 103. The CO 104 is coupled to the chassis 106 (1-N) to exchange information between the CO 104 and the chassis 106 (1-N). Communication link 105 illustrates a communication link between the CO 104 and chassis 106-1. The remaining chassis 106 (2-N) are also coupled to exchange information with the CO 104 similar to the way communication link 105 exchanges information between the CO 104 and chassis 106-1. Also illustrated are communication connections between chassis 106-1 and user equipment 114 (1-N).

FIG. 1 also illustrates a power supply 108 in the CO 104. The power supply 108 is coupled to provide power to chassis 106-1 via power supply lines 110A, 110B, 112A and 112B. In particular, in this embodiment, the power supply 108 provides DC power to primary power lines 110A and 110B and redundant power lines 112A and 112B which are coupled to the chassis 106-1. The power supply 108 also supplies primary and redundant lines to the other chassis 106 (2-N) in a manner similar to the primary and redundant power lines 110A, 110B, 112A and 112B between the power supply 108 and chassis 106-1. Also illustrated in FIG. 1 is noise reduction circuit 107 located in chassis 106-1. The noise reduction circuit 107 is coupled to the primary and redundant power lines 110A, 10B, 112A and 112B. The noise reduction circuit 107 is adapted to reduce the noise traveling back to the power supply 108 through the primary and redundant power lines 110A, 110B, 112A and 112B. Each of the other chassis 106 (2-N) also have a noise reduction circuit similar to the noise reduction circuit 107 of chassis 106-1.

Figure 2:
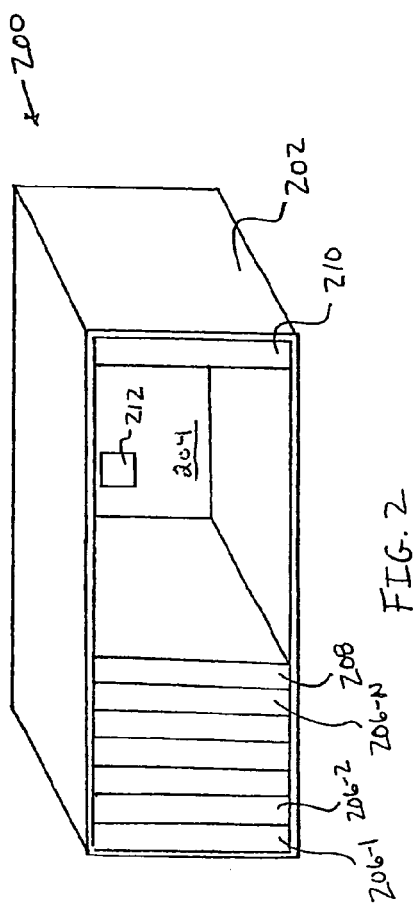
FIG. 2, is a prospective view of a chassis of one embodiment of the present invention.
Figure 3:
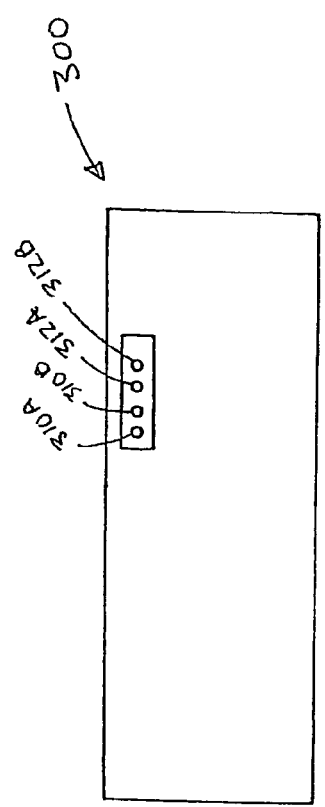
FIG. 3 is a back view of a chassis of one embodiment of the present invention.

FIG. 2, illustrates one embodiment of a chassis 200 of the present invention. As illustrated, chassis 200 includes a housing 202. A plurality of line cards 206 (1-N) are adapted to fit into the housing 202 and be selectively coupled to a backplane 204 of the chassis 200. Also illustrated as being selectively coupled to the backplane 204 is a multiplexer card 208 and a management card 210. It will be understood in the art that other types of cards are adaptable to be coupled to the backplane 204 and that the present invention is not limited to only line cards 206 (1-N), multiplexer cards 208 and management cards 210. Also illustrated in FIG. 2 is noise reduction circuit 212 which is coupled to the backplane 204. Power that is supplied to chassis 200 is passed through the noise reduction circuit 212 to the backplane 204. The line cards 206 (1-N), the multiplexer 208 and the management card 210 all receive their power off the backplane 204. The line cards 206 (1-N), the multiplexer card (208) and management card (210) generate multiple frequencies that support their functions. These multiple frequencies cause noise to return back to the power source through the backplane 204. The noise reduction circuit 212 is adapted to reduce the noise induced to the power source. FIG. 3, illustrates a back view of a chassis 300 of one embodiment of the present invention. The back view of chassis 300 illustrates power connections 310A, 310B, 312A and 312B. In particular, FIG. 3 illustrates primary power connections 310A and 310B and redundant power connections 312A and 312B. The power connections 310A, 310B, 312A and 312B are coupled to a noise reduction circuit housed in the chassis 300 which in turn is coupled to a backplane.

Figure 4:
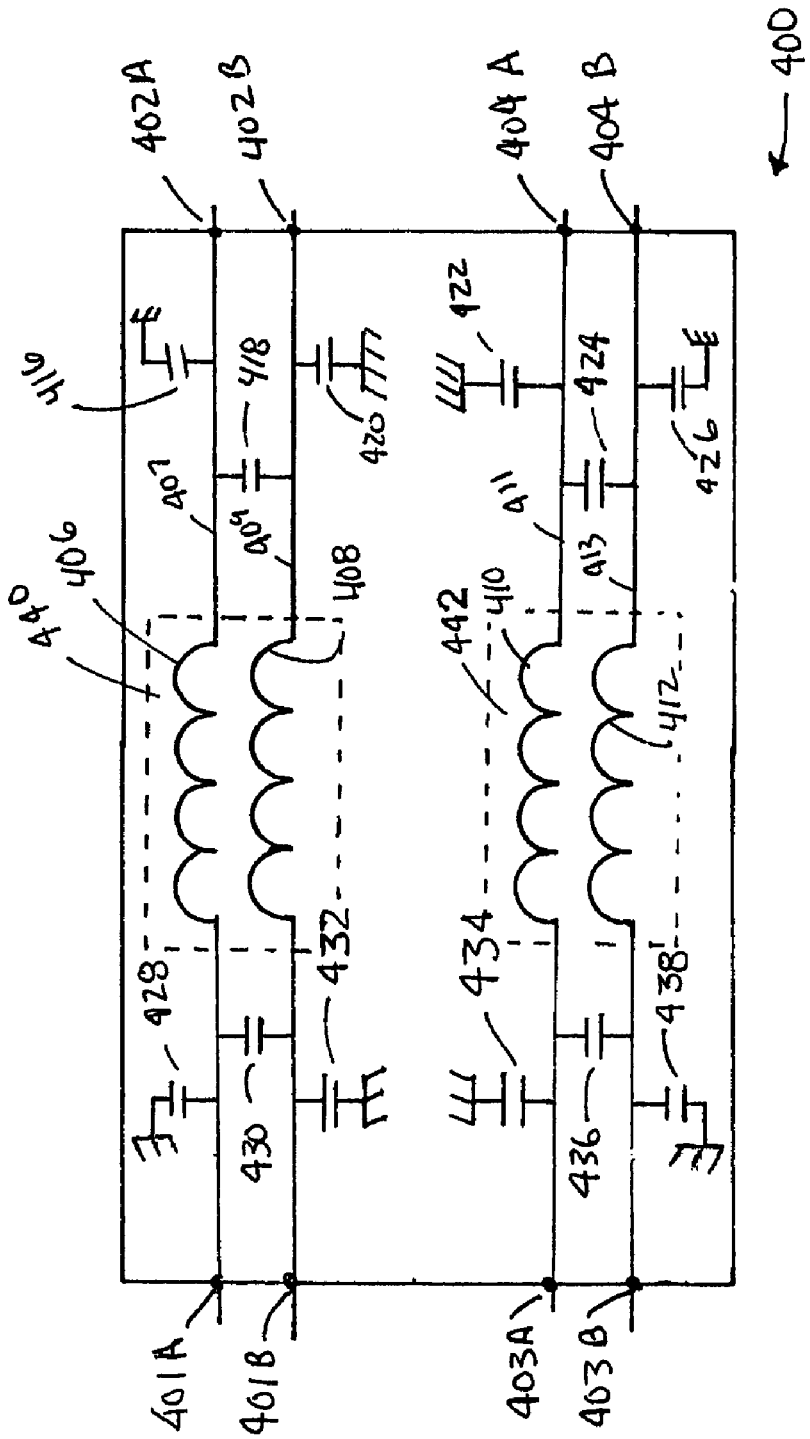
FIG. 4 is a schematic diagram of a $\pi$ filter of one embodiment of the present invention.

Referring to the schematic diagram of FIG. 4, one embodiment of a noise reducing circuit 400 of the present invention is illustrated. The noise reducing circuit 400 can be referred to as a π filter 400. As illustrated, the noise reducing circuit 400 includes primary inputs 402A and 402B and redundant inputs 404A and 404B. The primary and redundant inputs 402A, 402B, 404A and 404B are adapted to receive the primary and redundant power from a power supply. Also illustrated in FIG. 4, is primary outputs 401A and 401B and redundant outputs 403A and 403B. The primary inputs 402A and 402B may be referred to as a primary supply input 402A and a primary return input 402B respectfully, since current enters the primary supply input 402 from an associated power supply and returns to the power supply via the primary return input 402B. Likewise, the redundant inputs 404A and 404B may be referred to as the redundant supply input 404A and the redundant return input 404B respectfully. Moreover, the primary outputs 401A and 401B may be referred to as primary source output 401A and primary return output 401B. Finally, the redundant outputs 403A and 403B may be referred to as redundant source output 403A and redundant return output 403B respectfully.

A first wire 407 (or primary supply wire 407) is connected between primary supply input 402A and the primary source output 401A. A second wire 409 (or primary return wire 409) is connected between primary return input 402B and primary return output 401B. A third wire 411 (or redundant supply wire 411) is coupled between redundant supply input 404A and redundant supply output 403A. A fourth wire 42 (or redundant return wire 42) is coupled between redundant return input 404B and redundant return output 403B. Each of the wires 407, 409, 411 and 413 pass through a tube of ferrite 440 and 442. In particular, first and second wires 407 and 409 pass though primary ferrite tube 440 and third and forth wires 411 and 413 pass through redundant tube 442. As current in the wires 407, 409, 411 and 413 pass through their respective ferrite tube 440 and 442, the portion of the wires 407, 409, 411 and 413 that are in their respective tubes 440 and 442 behave like inductors 406, 408, 410 and 412 respectfully. The wires 407, 409, 411 and 413 and the respective ferrite tubes form the ferrite chokes of the present invention. By combining wires 407 and 409 in a single ferrite tube 440, DC components of a magnetic field created in the ferrite tube 440 by currents traveling through the wires 407 and 409 tend to cancel each other out because the current in wire 407 is traveling in the opposite direction of the current in wire 409. Otherwise, a DC component of the magnetic field would significantly reduce quality of filtering by offsetting magnetic parameters of the ferrite material into non-linear zone and consequently reducing inductance of the choke. The redundant wires 411 and 413 are set up the same way.

Also illustrated in FIG. 4 is a plurality of capacitors. In regards to the primary power supply wires 407 and 409, capacitor 416 is coupled between the primary input side of wire 407 and ground. Capacitor 428 is coupled between the primary output side of wire 407 and ground. Capacitor 420 is coupled between the primary input side of wire 409 and ground. Capacitor 432 is coupled between the primary output side of wire 409 and ground. Moreover, capacitor 418 is coupled between wires 407 and 409 on the primary input side of the noise reducing circuit 400. Capacitor 430 is coupled between wires 407 and 409 on the primary output side of the noise reducing circuit 400. In regards to the redundant power supply wires 411 and 413, capacitor 422 is coupled between the redundant input side of wire 411 and ground. Capacitor 434 is coupled between the redundant output side of wire 411 and ground. Capacitor 426 is coupled between the redundant input side of wire 413 and ground. Capacitor 438 is coupled between the redundant output side of wire 413 and ground. Moreover, capacitor 424 is coupled between wire 411 and wire 413 on the redundant input side of the noise reducing circuit 400. Capacitor 436 is coupled between wire 411 and wire 413 on the redundant output side of the noise reducing circuit 400. The capacitors 416, 420, 422, 426, 428, 432, 434 and 438 coupled between the respective wires 407, 409, 411 and 413 and ground, serve to reduce longitudinal signal differential. Capacitors 418, 424, 430 and 436 between the respective wires 407, 409, 411 and 413, serve to reduce differential noise signals between the respective wires 407 and 409 as well as wires 411 and 413. The combination of the inductors 406, 408, 410 and 412 and capacitors 416, 420, 422, 426, 428, 432, 434, 438, 407, 409, 411 and 413 forms the π filter. Accordingly, embodiments of the present invention allow for a π filter to be housed in a chassis to reduce noise in the primary and redundant power wires. A π filter absorbs noise more efficiently than just ferrite alone.

Figure 5:
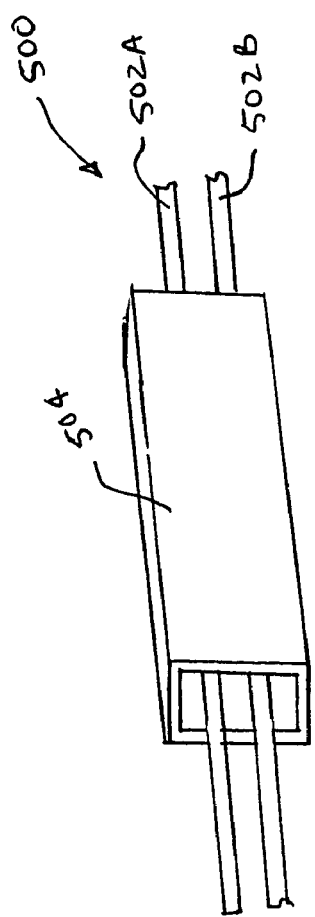
FIG. 5 is a prospective view of a ferrite choke of one embodiment of the present invention.
Figure 6:
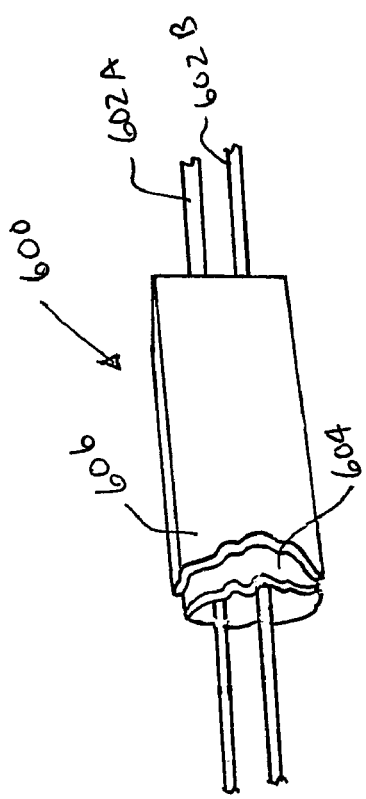
FIG. 6 is a cut-out perspective view of a ferrite choke of another embodiment of the present invention.

FIG. 5 illustrates one embodiment of a ferrite choke 500 of the present invention. As illustrated, the ferrite choke comprises a ferrite tube 504 and two wires 502A and 502B. Wire 502A is a supply wire 502A and wire 502B is a return wire 502B. The ferrite tube 504 is made of a single piece of ferrite. The single piece construction of the ferrite tube 504 improves the absorption of noise over a typical ferrite clamp. This is because it is practically impossible to remove small gaps between the two halves of a ferrite clamp that are clamped around a wire. These gaps reduce the efficiency of absorbing noise. The use of a ferrite tube 504 of the present invention without gaps provides a better ferrite for absorbing noise. FIG. 6 illustrates another embodiment of a ferrite choke 600 of the present invention. The ferrite choke 600 of FIG. 6 includes a supply and return wire 602A and 602B, a ferrite tube 604 and a protective covering 606. Since ferrite is generally fragile, the covering 606 is used to protect the ferrite tube 604 from breaking. This helps keep the ferrite tube from breaking when it comes in contact with other elements in a chassis during assembly process or while a vibration is applied to the product (for instance, building vibration, earthquake, etc.). The covering 606 also protects it from vibrations and jarring movements. In one embodiment the protective covering 606 is made from a heat-shrink wrap material (such as a plastic pipe) that is placed over the ferrite tube 604 and then heated up during an assembly process to shrink the material down to fit tightly around the ferrite tube 604.

Figure 7:
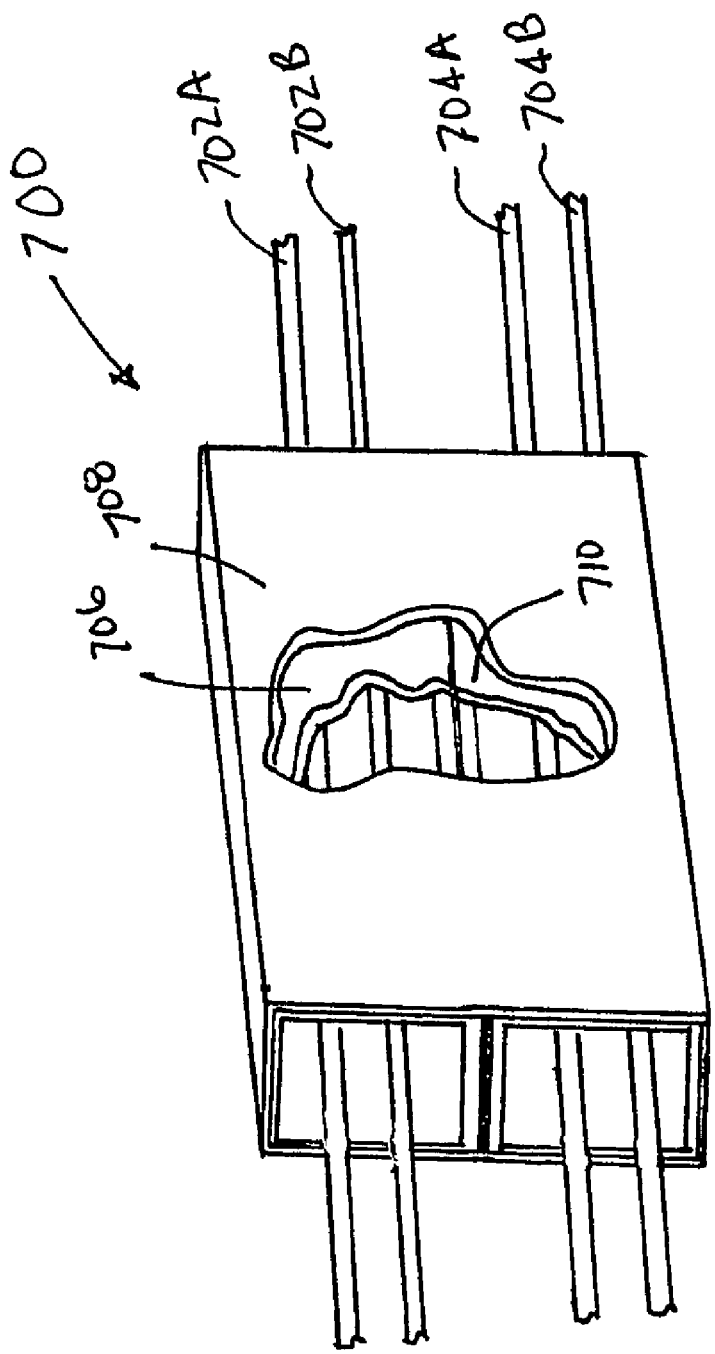
FIG. 7 is a cut-out perspective view of yet another ferrite choke of another embodiment of the present invention.

Referring to FIG. 7, a ferrite choke 700 of another embodiment of the present invention is illustrated. This embodiment includes a primary ferrite tube 706 having a primary supply wire 702A and a primary return wire 702B passing through the primary ferrite tube 706. This embodiment also includes a redundant ferrite tube 710 having a redundant supply wire 704A and a redundant return wire 704B passing through redundant ferrite tube 710. A protective covering 708 is formed over the primary and redundant tubes 706 and 710 to protect the primary and redundant tubes 706 and 710 and to also couple the primary and redundant ferrite tubes 706 and 710 together. By coupling the primary and redundant ferrite tubes 706 and 710 together with the protective covering, the ferrite tubes 706 and 710 can be efficiently housed in a chassis.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any such adaptations or variations of the invention. It is manifestly intended that this invention be limited only by the following claims and equivalents thereof.

What is claimed is:

1. A π filter comprising:
   a primary ferrite choke including,
      a primary tube of ferrite made of a single piece of ferrite,
      a primary supply wire received inside the tube of ferrite, and
      a primary return wire received inside the primary tube of ferrite; and
   a first primary capacitor coupled between the primary supply wire and ground;
   a second primary capacitor coupled between the primary return wire and ground; and
   a third primary capacitor coupled between the primary supply wire and the primary return wire;
   a redundant ferrite choke including,
      a redundant tube of ferrite made of a single piece of ferrite,
      a redundant supply wire received inside the redundant tube of ferrite, and
      a redundant return wire received inside the redundant tube of ferrite, and
   a first redundant capacitor coupled between the redundant supply wire and ground;
   a second redundant capacitor coupled between die redundant return wire and ground; and
   a third redundant capacitor coupled between the redundant supply wire and the redundant return wire.

2. The π filter of claim 1; further comprising:
   a protective covering adapted to cover an outside surface of the redundant ferrite tube.

3. The π filter of claim 1; further comprising:
   a protective covering adapted to couple the primary and redundant ferrite tubes together.

4. The π filter of claim 1, further comprising:
   the redundant supply wire having a input side adjacent a first side of the redundant ferrite choke and a redundant output side adjacent a second side of the redundant ferrite choke;
   the primary return wire having art input side adjacent the first side of the redundant ferrite choke and a return output side adjacent the second side of the redundant ferrite choke;
   the first redundant capacitor being coupled between the input side of the redundant supply wire and ground;
   the second redundant capacitor being coupled between the input side of the redundant return wire and ground; and the third redundant capacitor coupled being between die
input side of the redundant supply wire and the input
side of the redundant return wire.

5. The π filter of claim 4, further comprising:
a fourth redundant capacitor coupled between the output
side of the redundant supply wire and ground;
a fifth redundant capacitor coupled between the output
side of the redundant return wire and ground; and
a sixth redundant capacitor coupled between the output
side of the redundant supply wire and the output side of
the redundant return wire.

6. A chassis in a telecommunication system, the chassis
comprising:
a housing having a backplane, the backplane adapted to
receive a plurality of line cards, multiplexer cards and
a management card, the backplane further adapted to
receive power from a power supply; and
a π filter housed inside the chassis, the π filter coupled
between the power supply and the backplane, the π
filter further adapted to reduce noise back to the power
supply.

7. The chassis of claim 6, wherein the π filter further
comprises:
a ferrite tube;
a supply wire received in the ferrite tube;
a return wire received in the ferrite tube, die supply wire
and return wire coupled to the power supply; and
and one or more capacitors coupled to at least one of the
supply wire and the return wire and ground to reduce
noise.

8. The chassis of claim 6, wherein π filter further comprises:
a primary ferrite choke including,
a primary tube of ferrite made of a single piece of
ferrite,
a primary supply wire received inside the tube of
ferrite, the primary supply wire coupled to receive a
primary power source from the power supply, and
a primary return wire received inside the primary tube
of ferrite, the primary return wire coupled to return
the primary power source to the power supply; and
a first primary capacitor coupled between the primary
supply wire and ground;
a second primary capacitor coupled between the primary
return wire and ground; and
a third primary capacitor coupled between the primary
supply wire and the primary return wire.

9. The chassis of claim 8, wherein the π filter further
comprises:
a protective covering adapted to cover an outside surface
of the primary ferrite choke.

10. The chassis of claim 8, wherein π filter further
comprises:
the primary supply wire having a input side adjacent a first
side of the primary ferrite choke and a primary output
side adjacent a second side of the primary ferrite choke,
the primary return wire having an input side adjacent the
first side of the primary ferrite choke and a, primary
output side adjacent the second side of the primary
ferrite choke;
the first primary capacitor being coupled between the
input side of the primary supply wire and ground;
the second primary capacitor being coupled between the
input side of the primary return wire and ground; and
the third primary capacitor being coupled between the
input side of the primary supply wire and the input side
of the primary return wire.

11. The chassis of claim 10, wherein π filter further
comprises:
a fourth primary capacitor coupled between the output
side of the primary supply wire and ground;
a fifth primary capacitor coupled between the output side
of the primary return wire and ground; and
a sixth primary capacitor coupled between the output side
of the primary supply wire and the output side of the
primary return wire.

12. The chassis of claim 8, wherein π filter further
comprises:
a redundant ferrite choke including,
a redundant tube of ferrite made of a single piece of
ferrite,
a redundant supply wire received inside the redundant
tube of ferrite, the
redundant supply wire coupled to receive a redundant
power source from the power supply, and
a redundant return wire received inside the redundant
tube of ferrite, the redundant return wire coupled to
return the redundant power source to the power
supply; and
a first redundant capacitor coupled between the redundant
supply wire and ground;
a second redundant capacitor coupled between the redundant return wire and ground; and
a third redundant capacitor coupled between the redundant supply wire and the redundant return wire.

13. The chassis of claim 12, wherein the π filter further
comprising:
a protective covering adapted to cover an outside surface
of the redundant ferrite tube.

14. The chassis of claim 12, wherein the π filter further
comprising:
a protective covering adapted to couple the primary and
redundant ferrite tubes together.

15. The chassis of claim 12, wherein the π filter further
comprising:
the redundant supply wire having a input side adjacent a
first side of the redundant ferrite choke and a redundant
output side adjacent a second side of the redundant
ferrite choke;
the primary return wire having an input side adjacent the
first side of the redundant ferrite choke and a return
output side adjacent the second side of die redundant
ferrite choke;
the first redundant capacitor being coupled between the
input side of the redundant supply wire and wound;
the second redundant capacitor being coupled between the
input side of the redundant return wire and ground; and
the third redundant capacitor coupled being between the
input side of the redundant supply wire and the input
side of the redundant return wire.

16. The chassis of claim 15, wherein the π filter further
comprising:
a fourth redundant capacitor coupled between the output
side of the redundant supply wire and ground;
a fifth redundant capacitor coupled between the output
side of the redundant return wire and ground; and
a sixth redundant capacitor coupled between the output
side of the redundant supply wire and the output side of
the redundant return wire.

17. A telecommunication system comprising:
a central office coupled to a network to exchange information, the central office having a power supply; and
a chassis coupled to the central office to exchange information, the chassis adapted to pass on information to user equipment, the chassis further coupled to receive power from the power supply in the central office, the chassis further having a π filter housed inside the chassis adapted to filter out noise induced back to the power supply from the chassis.

18. The telecommunication system of claim 17, wherein the power supply in the central office is adapted to supply both a primary power supply and a redundant power supply to the chassis.

19. The telecommunication system of claim 17, wherein the π filter further comprises:
a ferrite tube;
a supply wire received in the ferrite tube;
a return wire received in the ferrite rube, the supply wire and return wire coupled to the power supply; and
and one or mare capacitors coupled to at least one of the supply wire and the return wire and ground to reduce noise.

20. The telecommunication system of claim 17, wherein the π filter further comprises;
a primary ferrite choke including,
a primary tube of ferrite made of a single piece of ferrite,
a primary supply wire received inside the tube of ferrite, the primary supply wire coupled to receive a primary power source from the power supply, and
a primary return wire received inside the primary tube of ferrite, the primary return wire coupled to return the primary power source to the power supply; and
a first primary capacitor coupled between the primary supply wire and ground;
a second primary capacitor coupled between the primary return wire and ground; and
a third primary capacitor coupled between the primary supply wire and the primary return wire.

21. The telecommunication system of claim 20, wherein the π filter further comprises:
a protective covering adapted to cover an outside surface of the primary ferrite choke.

22. The telecommunication system of claim 20, wherein π filter further comprises:
the primary supply wire having a input side adjacent a first side of the primary ferrite choke and a primary output side adjacent a second side of the primary ferrite choke;
the primary return wire having an input side adjacent the first side of the primary ferrite choke and a primary output side adjacent the second side of the primary ferrite choke;
the first primary capacitor being coupled between the input side of the primary supply wire and ground;
the second primary capacitor being coupled between the input side of the primary return wire and ground; and
the third primary capacitor being coupled between the input side of the primary supply wire and the input side of the primary return wire.

23. The telecommunication system of claim 22, wherein π filter further comprises:
a fourth primary capacitor coupled between the output side of the primary supply wire and ground;
a fifth primary capacitor coupled between the output side of the primary return wire and ground; and
a sixth primary capacitor coupled between the output side of the primary supply wire and the output side of the primary return wire.

24. The telecommunication system of claim 20, wherein π filter further comprises:
a redundant ferrite choke including,
a redundant tube of ferrite made of a single piece of ferrite,
a redundant supply wire received inside the redundant tube of ferrite, the redundant supply wire coupled to receive a redundant power source from the power supply, and
a redundant return wire received inside the redundant tube of ferrite, the redundant return wire coupled to return the redundant power source to the power supply; and
a first redundant capacitor coupled between the redundant supply wire and ground;
a second redundant capacitor coupled between the redundant return wire and ground; and
a third redundant capacitor coupled between the redundant supply wire and the redundant return wire.

25. The telecommunication system of claim 24, wherein the π filter further comprising:
a protective covering adapted to cover an outside surface of the redundant ferrite tube.

26. The telecommunication system of claim 24, wherein the π filter further comprising:
a protective covering adapted to couple the primary and redundant ferrite tubes together.

27. The telecommunication system of claim 24, wherein the π filter further comprising:
the redundant supply wire having a input side adjacent a first side of the redundant ferrite choke and a redundant output side adjacent a second side of the redundant ferrite choke;
the primary return wire having an input side adjacent the first side of the redundant ferrite choke and a return output side adjacent the second side of the redundant ferrite choke;
the first redundant capacitor being coupled between the input side of the redundant supply wire and ground;
the second redundant capacitor being coupled between the input side of the redundant return wire and ground; and
the third redundant capacitor coupled being between the input side of the redundant supply wire and the input side of the redundant return wire.

28. The telecommunication system of claim 27, wherein the π filter further comprising:
a fourth redundant capacitor coupled between the output side of the redundant supply wire and ground;
a fifth redundant capacitor coupled between the output side of the redundant return wire and ground; and
a sixth redundant capacitor coupled between the output side of the redundant supply wire and the output side of the redundant return wire.

* * * * *

UNITED STATES PATENT AND TRADEMARK OFFICE
CERTIFICATE OF CORRECTION

| | | |
|---|---|---|
| PATENT NO. | : 7,057,475 B2 | Page 1 of 1 |
| APPLICATION NO. | : 10/691248 | |
| DATED | : June 6, 2006 | |
| INVENTOR(S) | : Gottlieb et al. | |

It is certified that error appears in the above-identified patent and that said Letters Patent is hereby corrected as shown below:

At Claim 1, Column 6, Line 44, replace the first occurrence of "die" with --the--

At Claim 4, Column 6, Line 60, replace the first occurrence of "art" with --an--

At Claim 4, Column 7, Line 1, replace the first occurrence of "die" with --the--

At Claim 7, Column 7, Line 26, replace the first occurrence of "die" with --the--

At Claim 15, Column 8, Line 45, replace the first occurrence of "die" with --the--

Signed and Sealed this

Second Day of December, 2008

JON W. DUDAS
*Director of the United States Patent and Trademark Office*